United States Patent [19]
Theil et al.

[11] Patent Number: 6,083,572
[45] Date of Patent: *Jul. 4, 2000

[54] ORGANIC LOW-DIELECTRIC CONSTANT FILMS DEPOSITED BY PLASMA ENHANCED CHEMICAL VAPOR DEPOSITION

[75] Inventors: Jeremy A. Theil; Gary W. Ray, both of Mountain View; Karen L. Seaward; Francoise F. Mertz, both of Palo Alto, all of Calif.

[73] Assignee: Hewlett-Packard Company, Palo Alto, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/031,865

[22] Filed: Feb. 27, 1998

[51] Int. Cl.$^7$ ........................................ H05H 1/20

[52] U.S. Cl. ................ 427/573; 427/255.37; 427/397.7; 427/574; 427/579; 427/598

[58] Field of Search ..................... 427/490, 573, 427/294, 314, 255.37, 397.7, 574, 579, 598

[56] References Cited

PUBLICATIONS

Koji Miyata, Masaru Hori, and Toshio Goto, Dept. of Quantum Engrg., Nagoya Univ., Furo–cho, Chikusa–Ku, Nagoya 464–01, Japan; Infrared Diode Laser Absorption Spectroscopy Measurements of CFx (X=1–3) Radical Densities in Electron Cyclotron Resonance Plasmas Employing C4F8, C2F6, CF4, and CHF3 Gases; J.Vac. Sci. Technol. A 14(4), Jul./Aug. 1996; 1996 American Vacuum Society, pp. 2343–2350.

Stuardo Robles, Loreto Vasquez, Moshe Eizenberg, and Farhad Moghadam, Applied Materials, Inc., Santa Clara, California 95054, USA; "Characterization of High Density Plasma Chemical Vapor Deposited a–Carbon and a–Fluorinated Carbon Films for Ulta Low Dielectric Applications"; Feb. 10–11, 1997 DUMIC Conference, 1997 ISMIC–222D/97/0026; pp. 26–33, (No month available).

*Primary Examiner*—Bernard Pianalto
*Attorney, Agent, or Firm*—Brian R. Short

[57] ABSTRACT

A method of forming a low-dielectric constant film on a substrate. The method includes placing the substrate within a plasma processing chamber. Gas within the chamber is removed. A combination of hydrocarbon and hydrofluorocarbon gasses are flowed into the chamber. A high density plasma is created in the chamber. The high density plasma is extinguished. Finally, all gas is removed from the chamber. The method can additionally include a heating step after the film has been formed.

26 Claims, 10 Drawing Sheets

ORGANIC LOW-DIELECTRIC CONSTANT FILMS DEPOSITED BY PLASMA ENHANCED CHEMICAL VAPOR DEPOSITION

FIELD OF INVENTION

This invention relates generally to methods of forming low-dielectric constant films on substrates. In particular, it relates to methods of forming low-dielectric constant films on substrates by plasma enhanced chemical vapor deposition with a combination of hydrocarbon and hydrofluorocarbon.

BACKGROUND

Manufacturing of semiconductor devices requires the formation of electrical connections between conductive regions on a surface of a substrate. Generally, a series of non-conductive dielectric films are formed on the surface of the substrate which overlie electrically connected conductive regions. The conductive regions include electrical devices or electrical interconnection lines. Interconnection lines electrically connect different electrical devices on the substrate and allow for electrical contact to external leads.

Figure 1:
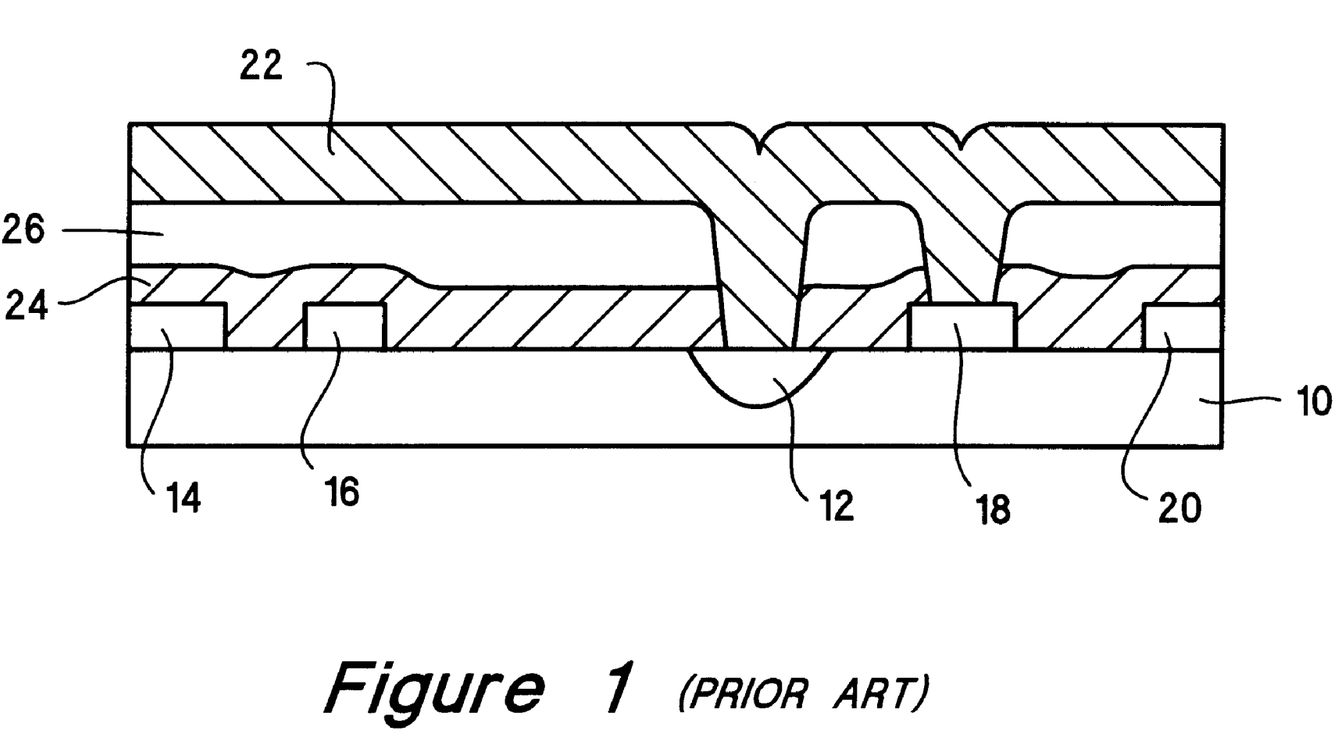
FIG. 1 is a perspective view of an integrated circuit substrate which depicts film layer(s).

FIG. 1 shows a semiconductor device. The semiconductor device includes a substrate 10 and an electrical device 12. The semiconductor device further includes interconnection lines 14, 16, 18, 20. A metal layer 22 electrically connects the electrical device 12 with interconnection line 18. A first dielectric layer 24 and a second dielectric layer 26 provide insulation between the electrical device 12, interconnection lines 14, 16, 18, 20 and the metal layer 22. Layer 24 can include a low-dielectric constant layer having adhesive layers on either side. When applying dielectric layers it is desirable to create a uniform surface, as close to a level, planar surface as possible, so as to facilitate the coverage of subsequent layers.

One of the best methods for deposition of dielectric films is known as chemical vapor deposition. This process forms solid films on substrates by the reaction of vapor phase chemical on the semiconductor surface. Chemical vapor deposition processes are preferred over other methods because they are more economical and because they allow for easy control over the deposition process. Chemical vapor deposition methods provide a high purity of deposited material and tend to have better fill capabilities than other methods of forming films.

Figure 2:
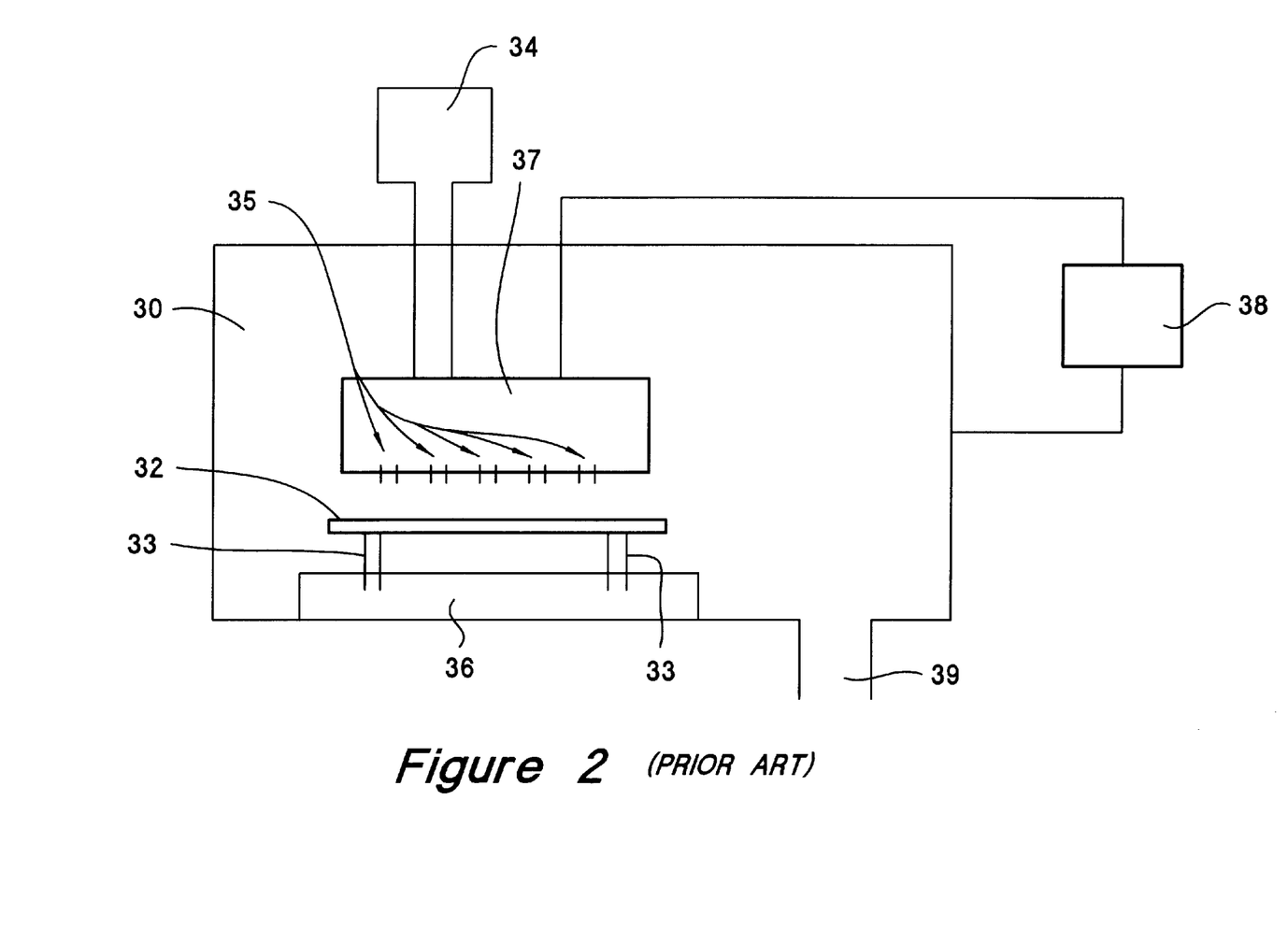
FIG. 2 shows a typical plasma processing chamber.

FIG. 2 shows a processing chamber 30 used for chemical vapor deposition. A semiconductor wafer 32 is placed onto a heating block 36 within the processing chamber 30. A gas feed 34 releases a composition of reactive gases and inert gases into the processing chamber 30 through nozzles 35 of a powered electrode 37. Upon reaction, these gases move onto the surface of substrates included on the semiconductor wafer 32. An exit pump 39 allows for removal of the gases. Pins 33 are used to separate the wafer 32 from the heating block 36 and to aid in the placement and removal of the wafer 32 within the chamber 30.

Plasma Enhanced Chemical Vapor Deposition (PECVD) methods can be used to deposit layers of silicon-dioxide ($SiO_2$) film. PEVCD methods for depositing films provide fast deposition rates and good step coverage. PEVCD methods require an rf-induced glow discharge provided by the powered electrode 37 which is connected to an rf-power supply 38. The rf-power supply 38 allows the transfer of energy to the reactive gases.

Silicon-dioxide ($SiO_2$) films have a dielectric constant of about 4.0. The dielectric constants of the films on a substrate determine the distributed capacitance associated with interconnections lines on the substrate. The distributed capacitance associated with the interconnection lines determines the operable frequency of electrical signals coupled through the interconnection lines. That is, the greater the distributed capacitance associated with the interconnection lines, the lower the operable frequency of the electrical signal coupled through the interconnection lines. The distributed capacitance associated with the interconnection lines can be reduced by reducing the dielectric constant of the deposited films. Reducing the dielectric constant of deposited films increases the operable frequency of electrical signals coupled through the interconnection lines.

It is desirable to have a method of forming dielectric films over a substrate which have lower dielectric constant than presently existing films. Further, the method would provide the benefits of present PEVCD methods.

SUMMARY OF THE INVENTION

The present invention provides a method of forming low-dielectric constant films on a substrate using PECVD methods. The films do not have a glass transition temperature and may be more thermally conductive than the typical $SiO_2$ films.

A first embodiment of the invention includes a method of forming a low-dielectric constant film on a substrate. The method includes placing the substrate within a plasma processing chamber. Next, all gas within the chamber is removed. A combination of hydrocarbon and hydrofluorocarbon gases is flowed into the chamber. A high density plasma is created in the chamber. Finally, the plasma is extinguished and all gas is removed from the chamber.

A second embodiment of the invention is similar to the first embodiment, but the combination of hydrocarbons and hydrofluorocarbon gasses includes greater than 75% $CHF_3$ and less than 25% $CH_4$.

A third embodiment of the invention is similar to the first embodiment. The third embodiment includes heating the substrate after the film has formed.

A fourth embodiment of the invention is similar to the third embodiment. The fourth embodiment includes heating the substrate after the film has been formed by flowing an inert gas into the chamber, and heating the substrate to between 200 degrees Celsius and 450 degrees Celsius for a time period of up to 60 minutes.

A fifth embodiment of the invention is similar to the second embodiment. The fifth embodiment includes flowing a noble gas into the chamber.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a method of forming low-dielectric constant films on a substrate. The films formed by the invention provide a low-dielectric constant while still providing the advantages offered by standard PECVD film fabrication methods.

Figure 3:
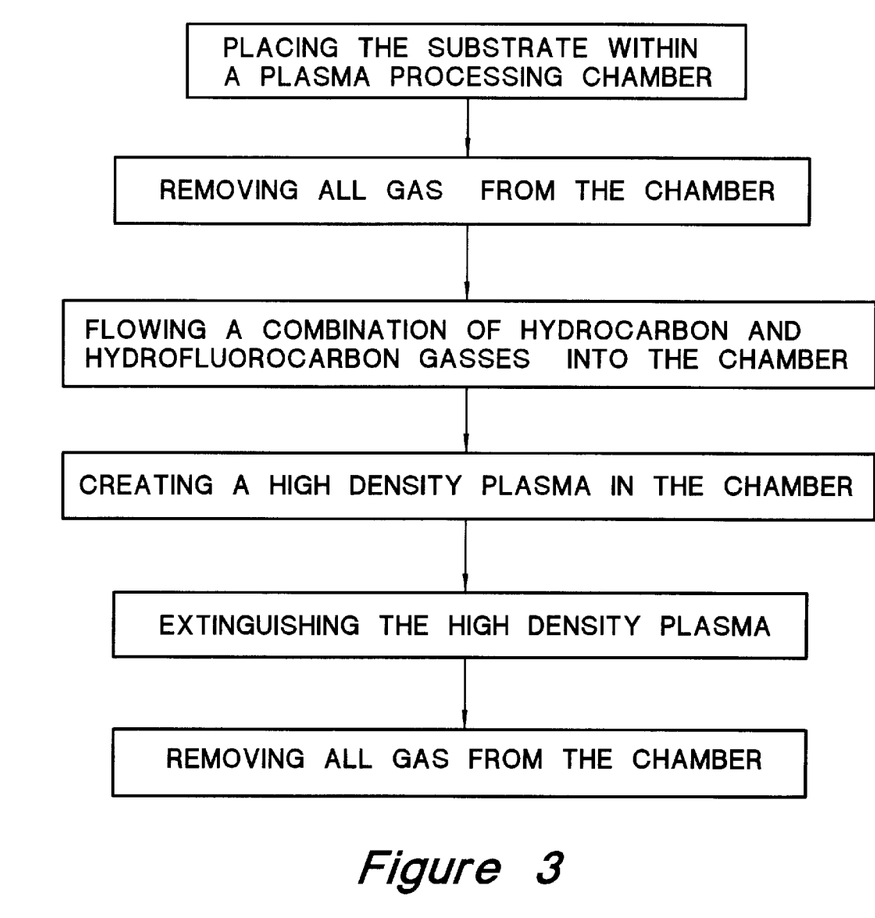
FIG. 3 is a flow chart of an embodiment of the invention.

FIG. 3 is a flow chart depicting a first embodiment of the invention for forming a low-dielectric constant film on a substrate. This embodiment includes a first step 32 of placing the substrate within a plasma processing chamber. A second step 34 includes all gas being removed from the chamber. A third step 36 includes flowing a combination of hydrocarbon and hydrofluorocarbon gasses into the chamber. A fourth step 38 includes creating a high density plasma in the chamber. The order of the third step 36 and the fourth step 38 can be interchanged. A fifth step 39 includes extinguishing the high density plasma. Finally, a sixth step 40 includes removing all gas from the chamber.

The benefits provided by the invention and alternative embodiments to the invention can be demonstrated through the depiction of test results of the characteristics of films produced by the invention. A parallel plate capacitor consisting of two conductive plates and a low-dielectric constant film formed by the invention, was fabricated and tested. The dielectric constant of the film was determined by measuring the capacitance of the fabricated capacitor and by knowing the physical dimensions of the fabricated capacitor. Additionally, the resistive component of the impedance of the capacitor was determined by measuring the loss tangent of the fabricated capacitor. Ideally, both the dielectric constant and the loss tangent are minimal.

The dielectric constant, the loss tangent and the mechanical stability of the fabricated capacitor were characterized with variations in the ratio of fluorine to hydrogen gasses flowed into the processing chamber in the third step 36 of the first embodiment of the invention. Additionally, the dielectric constant, the loss tangent and mechanical stability of the fabricated capacitor were characterized with variations in the amount of time the fabricated capacitor was exposed to thermal heat treatments.

Figure 4:
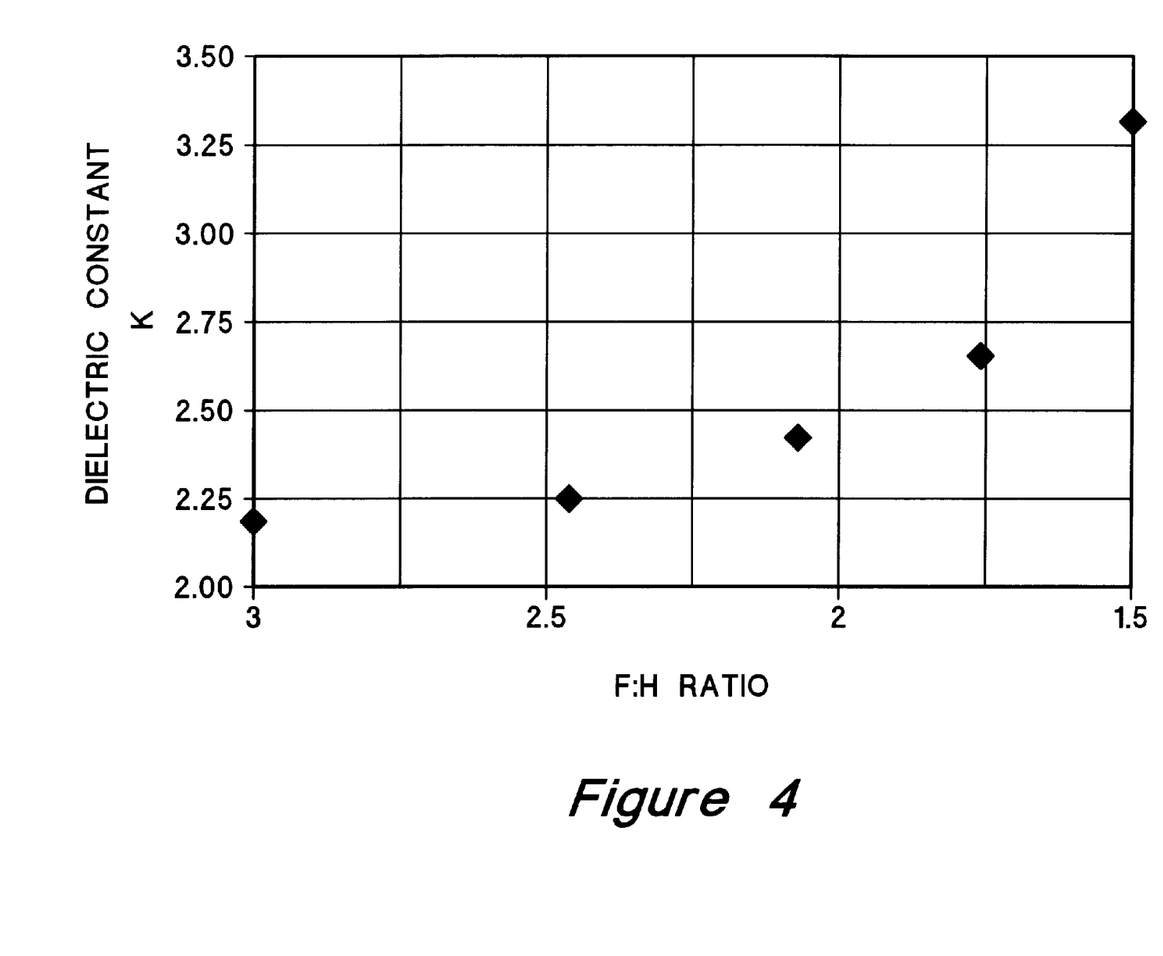
FIG. 4 is a plot of the resultant dielectric constants of films formed by the invention with variations in the ratio of fluorine to hydrogen flowed into the processing chamber.

An LCR meter and manual probe test stand were used to make the electrical measurements. The electrical measurement were made at a test frequency of 100 KHz. FIG. 4 is a plot of the resultant dielectric constants of films formed by the invention with variations in the ratio of fluorine to hydrogen flowed into the processing chamber. As depicted by the plot, a fluorine to hydrogen ratio of 3:1 resulted in a dielectric constant of about 2.24. A fluorine to hydrogen ratio of 1.5:1 resulted in a dielectric constant of about 3.26. The dielectric constant of an $SiO_2$ film formed by present PEVCD processes is about 4.0. Therefore, the dielectric constants of films formed by the invention are substantially less than the dielectric constants of films produced by present PEVCD methods.

Figure 5:
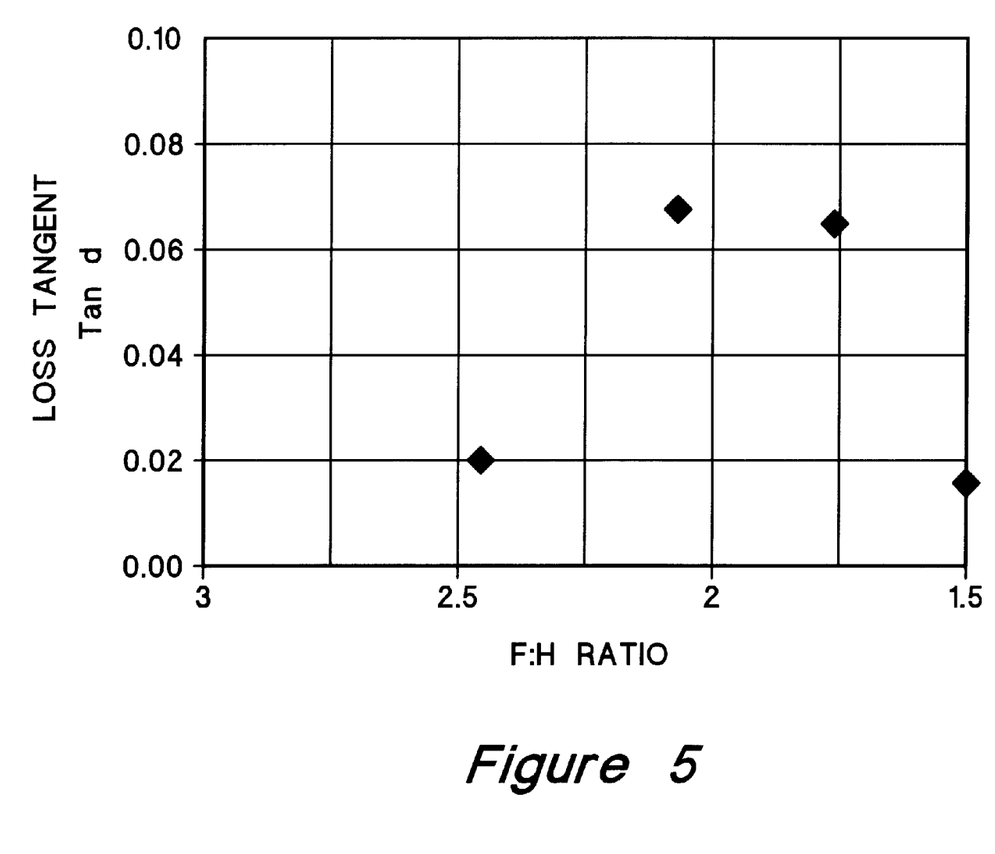
FIG. 5 is a plot of the resultant loss tangents of films formed by the invention with variations in the ratio of fluorine to hydrogen flowed into the processing chamber.

FIG. 5 is a plot of the resultant loss tangents of films formed by the invention with variations in the ratio of fluorine to hydrogen flowed into the processing chamber. An ideal film has a loss tangent (tan d) of zero.

FIG. 4 shows that as the amount of fluorine is decreased, the dielectric constant of the formed film increases. FIG. 5 shows that the relationship between the amount of fluorine and the loss tangent is scattered. The mean of the measured loss tangent values is about 0.05. The loss tangent of a typical polyimide film is about 0.01.

Figure 6:
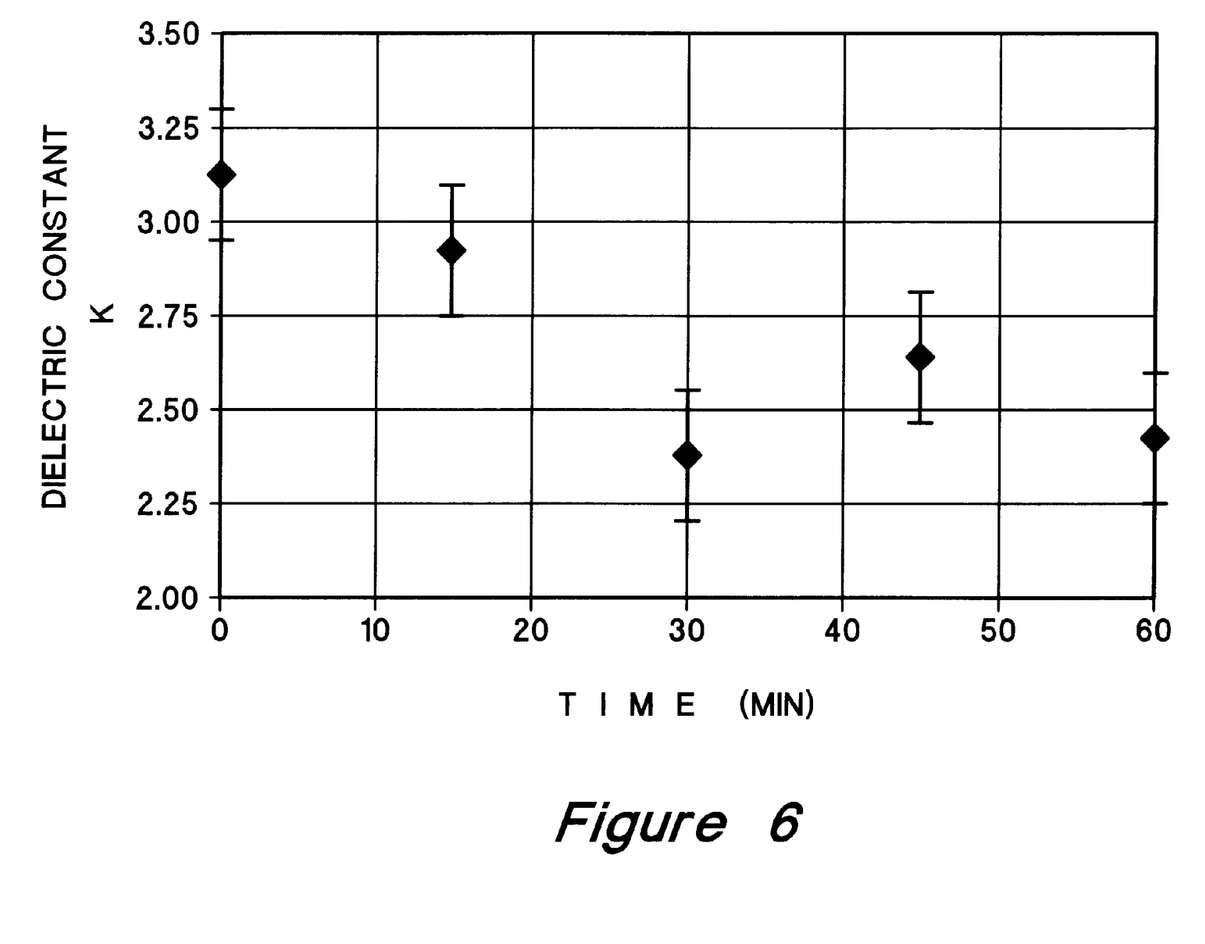
FIG. 6 is a plot of the dielectric constant of a film formed by the invention while being thermally heat soaked.

Films formed by the methods of this invention were further characterized while being exposed to thermal heat soaking. FIG. 6 is a plot of the dielectric constant of a film formed by the invention while being thermally heat soaked. The conditions of the heat soak consisted of the film being held at a temperature of 400° Celsius and a pressure of 4 Torr Ar. Again, the test frequency was 100 KHz. The film was formed with a fluorine to hydrogen ratio of 1.5:1. The substrate which the film was formed on was biased to a voltage potential of x50 Volts while the film was formed.

The plot of FIG. 6 shows that the dielectric constant of the films formed by the methods of the invention can be decreased by thermally heat soaking the films. The plot shows that the dielectric constant of the film dropped to a minimum of about 2.27 after 30 minutes of heat soaking.

Figure 7:
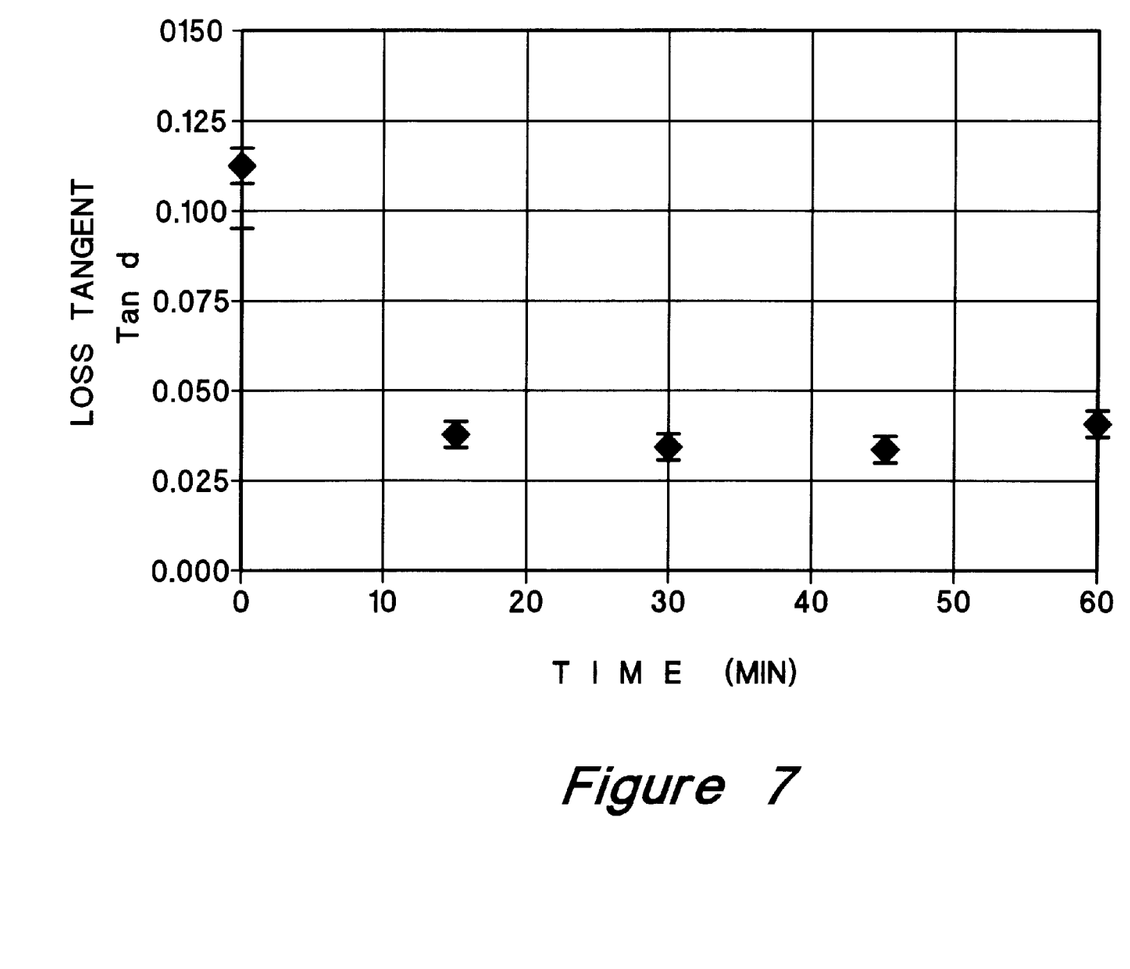
FIG. 7 is a plot which depicts the loss tangent (tan d) for the film depicted in FIG. 6.

FIG. 7 is a plot which depicts the loss tangent (tan d) for the film depicted in FIG. 6. The loss tangent falls to a minimum value of about 0.027 after about 30 minutes of thermal heat soaking. The plot shows that the loss tangent of the films formed by the methods of the invention can be decreased by thermally heat soaking the films.

Figure 8:
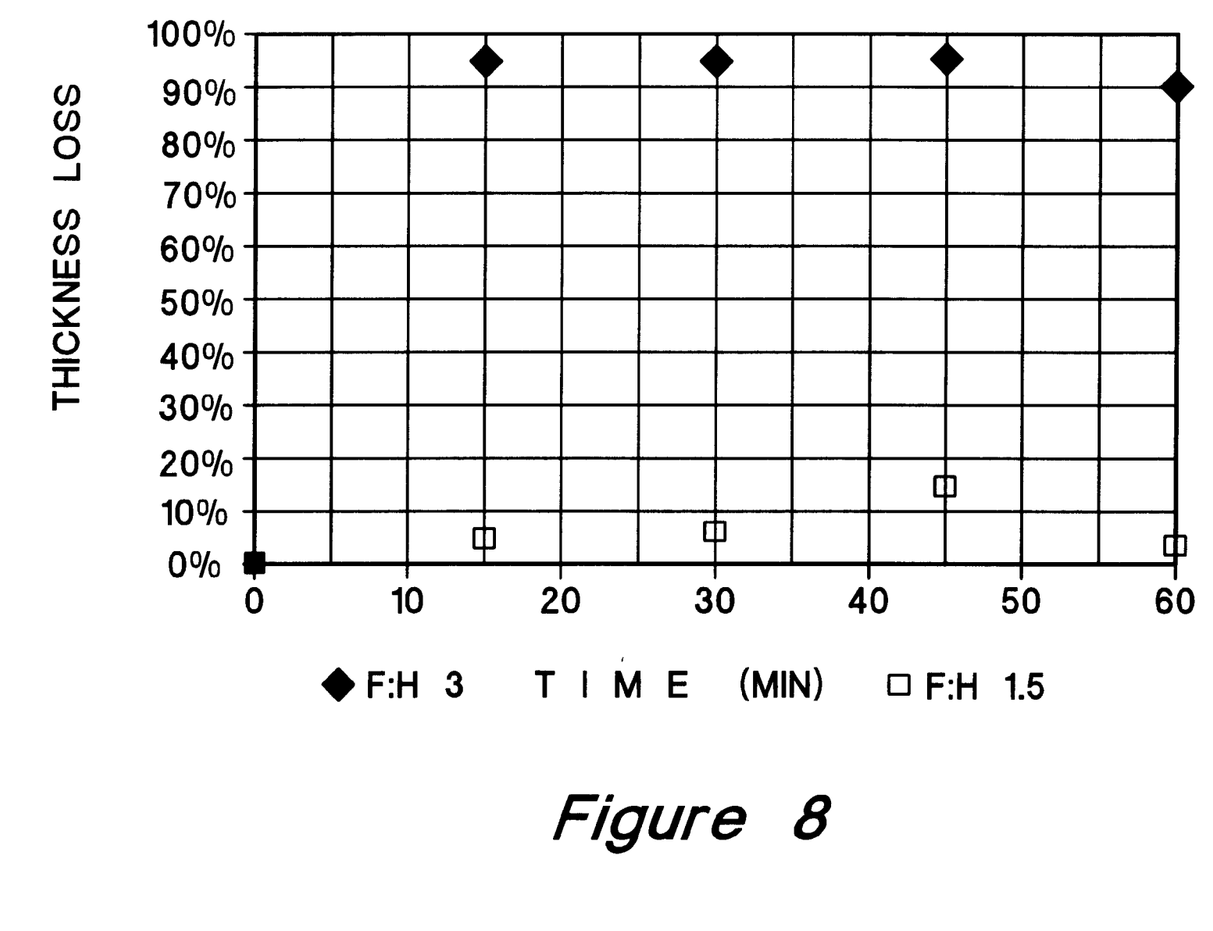
FIG. 8 is a plot showing the effect of thermal treatments to the thickness of films fabricated according to the invention when successive heat cycles are subsequently applied to the film.

Thermal soaking of the fabricated films can affect the stability of the films. Of the films tested, the film fabricated with a fluorine to hydrogen ratio of 1.5:1 was found to be the most stable. The film fabricated with a fluorine to hydrogen ratio of 3.0:1 was found to be the least stable. FIG. 8 is a plot showing the effect of thermal treatments to thickness of films fabricated according to the invention when successive heat cycles are subsequently applied to the film. The thermal treatments included the films being soaked at a temperature of 400° Celsius and a pressure of 4 Torr Ar. The film substrate was biased to a voltage of −40 Volts.

Generally, the films lost thickness upon exposure to heating cycles. A few samples, however, increased in thickness by a few percent. As shown by FIG. 8, the thickness loss for the 1.5:1 F:H film is about 7%, while for the 3.0:1 F:H films the thickness loss is about 95%. Experimentally, it appears that the majority of film thickness loss occurs within the first few minutes of the heat cycle. There is essentially no change after 15 minutes.

The test results show that films with dielectric constants as low as 2.2 can be deposited. Films with dielectric constant over 3.0 when initially deposited, decrease to a low as 2.4 when exposed to thermal cycling.

Another embodiment of the invention is similar to the first embodiment. For this embodiment, the third step 36 of flowing a combination of hydrofluorocarbon and hydrocarbon gasses into the chamber includes greater than 75% $CHF_3$ and less than 25% $CH_4$.

Hydrofluorocarbons are generally defined as gasses that include carbon (C), hydrogen (H) and fluorine (F). Fluorocarbons are generally defined as gasses that include C and F, and that may also include H. Perfluorocarbons are generally defined as gasses that only include C and F.

Hydrofluorocarbon gasses that can be included in the methods of the invention include CHF3, CH2F2, CH3F, C2F2H2, C2F5H, C2F4H2, C2F3H3 and C4F5H3. Hydrocarbon gasses that can be included in the methods of the invention include CH4, C2H4, C2H6, C2H2, C6H6, C3H8 and C4H8. These lists are not exhaustive. Rather, they include simple organic molecules that either provide a source of hydrogen and film producing fragments, or are fluorohydrocarbons that are either likely to break up by removing a fluorine-hydrogen group or break-up into at least one carbon-containing fragment that may include two dangling bonds.

Another embodiment of the invention is similar to the first embodiment. For this embodiment, the third step 36 of flowing a combination of hydrofluorocarbon and hydrocarbon gasses into the chamber additionally includes flowing a noble gas into the chamber. The noble gases can be used to tune the deposition chemistry through metastable-facilitated reactions. Additionally, the noble gases may facilitate gap fill capabilities by film sputtering.

Another embodiment of the invention is similar to the first embodiment. This embodiment includes heating the substrate after the film has formed. The previously presented test result show that subsequent heating generally reduces the dielectric constant of the film. Post deposition heating of the substrate can enhance the stability of the film. Heating removes low molecular weight fraction molecules in the films, as well as reducing the amount of fluorine in the film that would later migrate and cause chemical reactions with other films on the wafer.

Heating the substrate can include flowing an inert gas into the chamber and heating the substrate to between 200 degrees Celsius and 450 degrees Celsius for a time period of up to 60 minutes. Alternately, the substrate can be heated in a tube furnace, a rapid thermal annealing (RTA) chamber, a deposition reactor, a high temperature oven or a vacuum oven.

More specifically, heating the substrate can include heating the substrate to about 400 degrees Celsius for a time period of between 2 minutes and 30 minutes while the chamber is at a pressure of about 4 Torr. The substrate can be heated by lamp heating or resistive heating.

Figure 9:
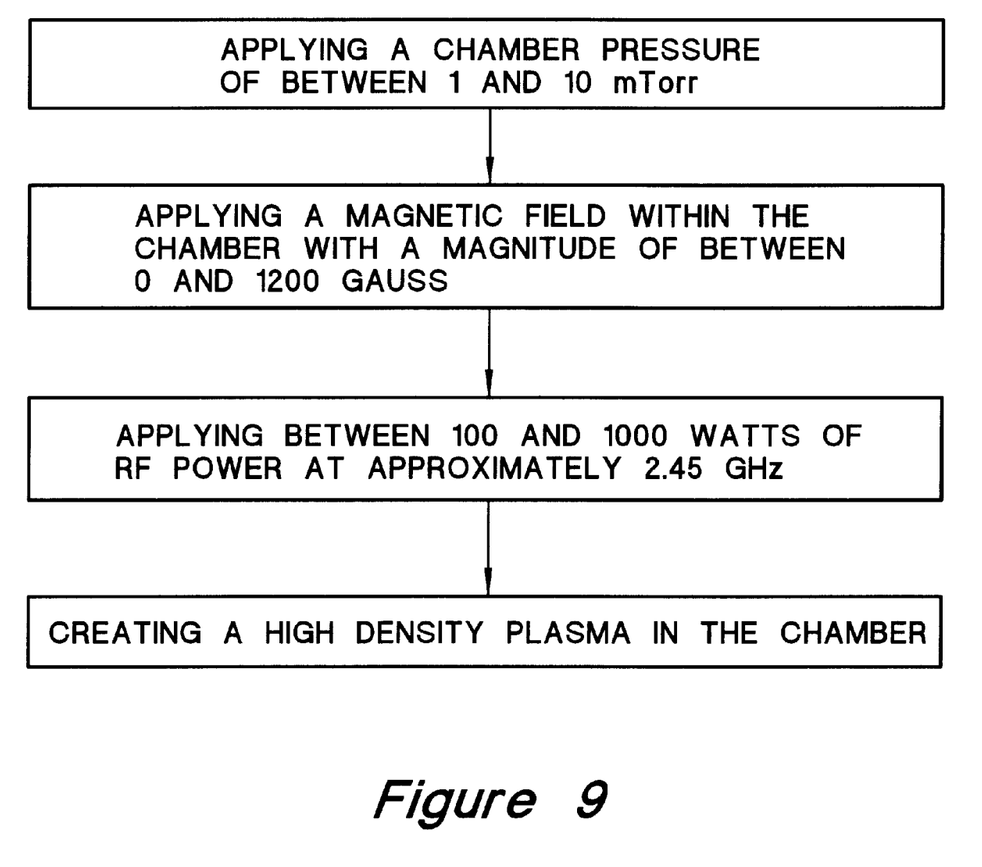
FIG. 9 is a flow chart which shows a method of creating a high density plasma in the chamber of the invention.

FIG. 9 is a flow chart which shows a method of creating a high density plasma in the chamber of the invention. The method includes applying a pressure within the chamber of between 0.1 and 20 mTorr. A magnetic field with a magnitude between 0 and 1200 Gauss is applied to the chamber. Between 100 and 1000 watts of RF power at approximately 2.45 GHz is applied to the chamber through a dielectric window. Finally, a high density plasma is created within the chamber. The creation of high density plasma is well known in the art of PECVD.

Another embodiment includes biasing the substrate to improve the gap filling characteristics of the film. The substrate is biased with a DC or RF voltage which does not resonate with any frequency components of the power supply of the processing chamber.

Another embodiment includes controlling the temperature of the substrate during the formation of the film on the substrate. Generally, the temperature of the substrate is set to below 100 degrees Celsius. More specifically, the temperature of the substrate is set to 5 degrees Celsius.

Figure 10:
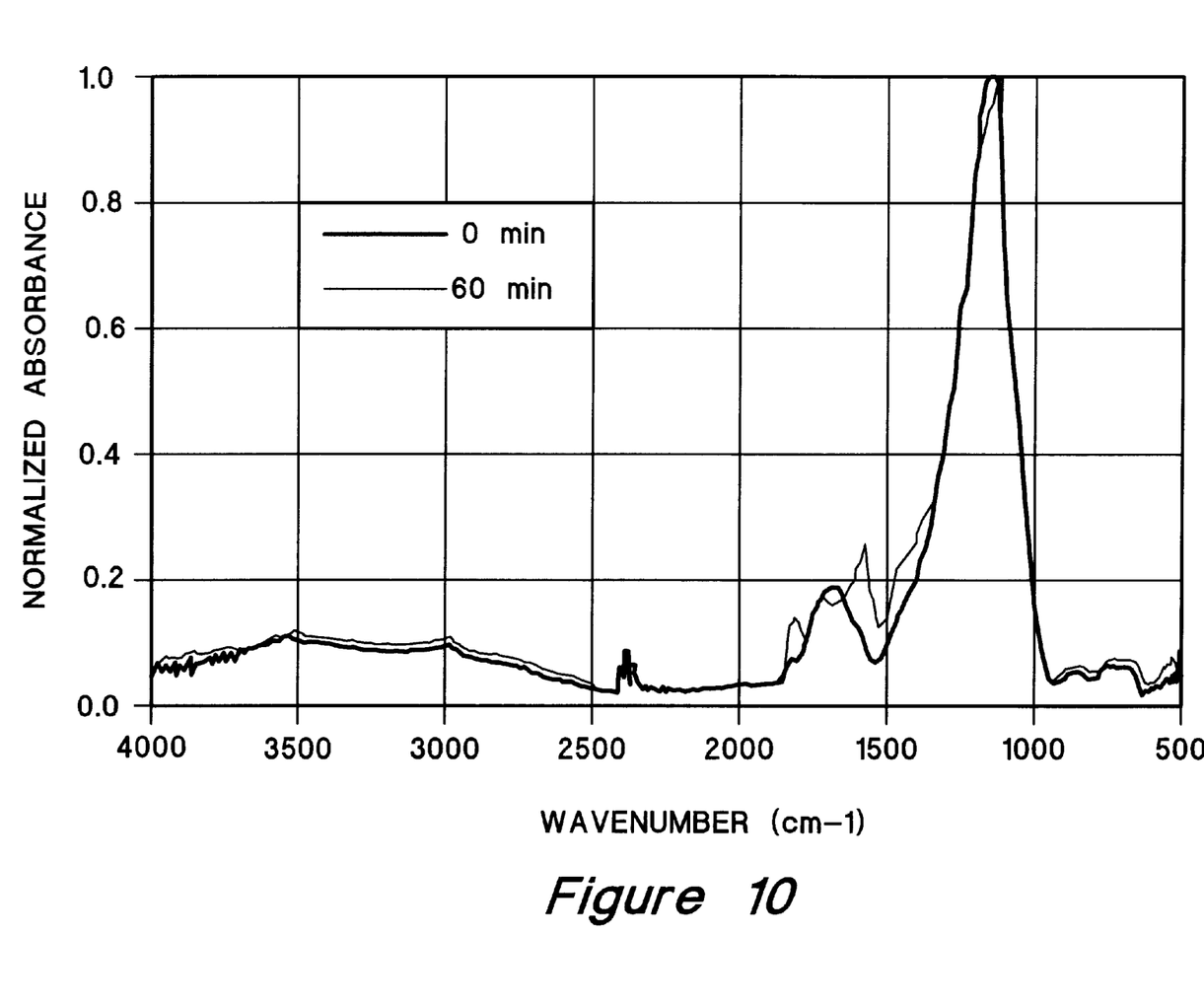
FIG. 10 is a plot of an infrared spectrum of a film formed by the invention before and after heating.

FIG. 10 is a plot of an infrared (IR) spectrum of a film formed by the invention. The plot includes the IR spectrum of the film before being heated, and the IR spectrum of the film after being heated for 60 minutes. The IR spectrum can be determined by performing a transmission measurement on the film from about 4000 $cm^{-1}$ to 400 $cm^{-1}$. The IR transmission measurements are converted to absorbance using a thin film approximation. The IR spectrum includes a combination of peaks unique to films formed according to the invention which provide a means for detecting whether films have been formed according to the invention. Specifically, peaks in the IR spectrum are observable at about 750 $cm^{-1}$, 950 to 1550 $cm^{-1}$, 1850 $cm^{-1}$ and 3550 $cm^{-1}$.

Although specific embodiments of the invention have been described and illustrated, the invention is not to be limited to the specific forms or arrangements of parts so described and illustrated. The invention is limited only by the claims.

What is claimed:

1. A method of forming a low-dielectric constant film on a substrate comprising:
    (a) placing the substrate within a plasma processing chamber;
    (b) removing all gas from the chamber;
    (c) flowing a combination of hydrocarbon and hydrofluorocarbon gasses into the chamber, allowing formation of a low-dielectric constant film that can be used to form a capacitor on the substrate;
    (d) creating a high density plasma in the chamber;
    (e) extinguishing the high density plasma;
    (f) removing all gas from the chamber; and
    (g) heating the substrate after the film has formed.

2. The method of forming a film on a substrate as recited in claim 1, wherein step (c) comprises flowing a combination of hydrocarbon and hydrofluorocarbon gases which includes less than 25% $CH_4$ and greater than 75% $CHF_3$.

3. The method of forming a film on a substrate as recited in claim 1, wherein step (c) further comprises flowing a noble gas into the chamber.

4. The method of forming a film on a substrate as recited in claim 1, wherein step (d) comprises creating a high density plasma in the chamber while the pressure within the chamber is less than 50 mTorr.

5. The method of forming a film on a substrate as recited in claim 1, wherein step (d) comprises
    applying a pressure within the chamber of between 1 and 10 mTorr;
    creating a high density plasma in the chamber;
    applying to the chamber between 500 and 1000 watts of RF power at approximately 2.45 Ghz; and
    applying a magnetic field within the chamber with a magnitude of between 0 and 1200 Guauss.

6. The method of forming a film on a substrate as recited in claim 1, further comprising applying a voltage potential of between 0 volts and −500 volts to the substrate.

7. The method of forming a film on a substrate as recited in claim 6, wherein the voltage potential applied to the substrate is an RF signal having an amplitude of about −200 volts and a frequency of about 13.56 MHZ.

8. The method of forming a film on a substrate as recited in claim 1, wherein step (d) comprises creating a high density plasma in the chamber wherein the density of the plasma is between $10^{10}$ and $10^{13}$ ions per cubic centimeter.

9. The method of forming a film on a substrate as recited in claim 1, wherein heating the substrate comprises:
    flowing an inert gas into the chamber; and heating the substrate to between 200 degrees Celsius and 450 degrees Celsius for a time period of less than 60 minutes.

10. The method of forming a film on a substrate as recited in claim 1, wherein heating the substrate comprises heating the substrate to about 400 degrees Celsius for a time period of between 2 minutes and 30 minutes while the chamber is at a pressure of about 4 Torr.

11. The method of forming a film on a substrate as recited in claim 1, wherein a temperature of the substrate is below 100 degrees Celsius.

12. The method of forming a film on a substrate as recited in claim 11, wherein the temperature of the substrate is 5 degrees Celsius.

13. A method of forming a low-dielectric constant film on a substrate comprising:

(a) placing the substrate within a plasma processing chamber;

(b) removing all gas from the chamber;

(c) flowing a combination of hydrocarbon and hydrofluorocarbon gasses into the chamber, allowing formation of a low-dielectric constant film that can be used to form a capacitor on the substrate;

(d) creating a high density plasma in the chamber;

(e) extinguishing the high density plasma; and (f) removing all gas from the chamber.

14. A method of forming a low-dielectric constant film on a substrate comprising:

(a) placing the substrate within a plasma processing chamber;

(b) removing all gas from the chamber;

(c) creating a high density plasma in the chamber;

(d) flowing a combination of hydrocarbon and hydrofluorocarbon gasses into the chamber, allowing formation of a low-dielectric constant film that can be used to form a capacitor on the substrate;

(e) extinguishing the high density plasma;

(f) removing all gas from the chamber and (g) heating the substrate after the film has formed.

15. The method of forming a film on a substrate as recited in claim 14, wherein step (c) comprises flowing a combination of hydrocarbon and hydrofluorocarbon gases which includes less than 25% $CH_4$ and greater than 75% $CHF_3$.

16. The method of forming a film on a substrate as recited in claim 14, wherein step (c) further comprises flowing a noble gas into the chamber.

17. The method of forming a film on a substrate as recited in claim 14, wherein step (d) comprises creating a high density plasma in the chamber while the pressure within the chamber is less than 50 mTorr.

18. The method of forming a film on a substrate as recited in claim 14, wherein step (d) comprises applying a pressure within the chamber of between 1 and 10 mTorr;

creating a high density plasma in the chamber;

applying to the chamber between 500 and 1000 watts of RF power at approximately 2.45 Ghz; and applying a magnetic field within the chamber with a magnitude of between 0 and 1200 Gauss.

19. The method of forming a film on a substrate as recited in claim 14, further comprising applying a voltage potential of between 0 volts and −500 volts to the substrate.

20. The method of forming a film on a substrate as recited in claim 19, wherein the voltage potential applied to the substrate is an RF signal having an amplitude of about 200 volts and a frequency of about 13.56 MHZ.

21. The method of forming a film on a substrate as recited in claim 14, wherein step (d) comprises creating a high density plasma in the chamber wherein the density of the plasma is between $10^{10}$ and $10^{13}$ ions per cubic centimeter.

22. The method of forming a film on a substrate as recited in claim 14, wherein heating the substrate comprises:

flowing an inert gas into the chamber; and heating the substrate to between 200 degrees Celsius and 450 degrees Celsius for a time period of less than 60 minutes.

23. The method of forming a film on a substrate as recited in claim 14, wherein heating the substrate comprises heating the substrate to about 400 degrees Celsius for a time period of between 2 minutes and 30 minutes while the chamber is at a pressure of about 4 Torr.

24. The method of forming a film on a substrate as recited in claim 14, wherein a temperature of the substrate is below 100 degrees Celsius.

25. The method of forming a film on a substrate as recited in claim 25, wherein the temperature of the substrate is 5 degrees Celsius.

26. A method of forming a low-dielectric constant film on a substrate comprising:

(a) placing the substrate within a plasma processing chamber;

(b) removing all gas from the chamber;

(c) flowing a combination of hydrocarbon and hydrofluorocarbon gasses into the chamber, allowing formation of a low-dielectric constant film that can be used to form a capacitor on the substrate;

(d) flowing a noble gas into the chamber;

(e) creating a high density plasma in the chamber;

(f) extinguishing the high density plasma; and (g) removing all gas from the chamber.

* * * * *